United States Patent
Kuo et al.

(10) Patent No.: US 11,101,441 B2
(45) Date of Patent: Aug. 24, 2021

(54) QUANTUM DOT LIGHT-EMITTING DIODE AND MANUFACTURING METHOD THEREOF

(71) Applicant: AU Optronics Corporation, Hsin-Chu (TW)

(72) Inventors: Ming-Cheng Kuo, Hsin-Chu (TW); Yao-Shan Chang, Hsin-Chu (TW); Po-Liang Chen, Hsin-Chu (TW); Chin-Cheng Tsai, Hsin-Chu (TW); Yi-Ju Hsiao, Hsin-Chu (TW); Ya-Pei Kuo, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 12 days.

(21) Appl. No.: 16/743,738

(22) Filed: Jan. 15, 2020

(65) Prior Publication Data

US 2020/0266372 A1    Aug. 20, 2020

(30) Foreign Application Priority Data

Feb. 20, 2019   (TW) ................. 108105677

(51) Int. Cl.
*H01L 51/50* (2006.01)
*H01L 51/52* (2006.01)
*H01L 51/56* (2006.01)

(52) U.S. Cl.
CPC ........ *H01L 51/502* (2013.01); *H01L 51/5056* (2013.01); *H01L 51/5072* (2013.01);
(Continued)

(58) Field of Classification Search
CPC ............... H01L 51/502; H01L 51/5072; H01L 2251/301; H01L 2251/5369
See application file for complete search history.

(56) References Cited

U.S. PATENT DOCUMENTS

| 2008/0150425 A1 | 6/2008 | Cho et al. |
| 2010/0213438 A1 | 8/2010 | Cho et al. |

(Continued)

FOREIGN PATENT DOCUMENTS

| CN | 101834277 A | 9/2010 |
| CN | 108352451 A | 7/2018 |
| WO | WO 2017/039774 A2 | 3/2017 |

OTHER PUBLICATIONS

Moon Sung Kang et al., "Size-Dependent Electrical Transport in CdSe Nanocrystal Thin Films", Nano Letter, Published on Aug. 23, 2010, 2010, 10, American Chemical Society, p. 3727-3732.
(Continued)

*Primary Examiner* — Anthony Ho
(74) *Attorney, Agent, or Firm* — WPAT, PC

(57) ABSTRACT

A quantum dot light-emitting diode includes a substrate, an anode electrode layer, a cathode electrode layer, a light-emitting layer, and an electron blocking layer. The anode electrode layer is disposed on the substrate. The cathode electrode layer is disposed on the anode electrode layer. The light-emitting layer is disposed between the cathode electrode layer and the anode electrode layer. The light-emitting layer includes a plurality of first particles. The electron blocking layer is disposed between the light-emitting layer and the anode electrode layer. The electron blocking layer includes a plurality of second particles. The first particles and the second particles are quantum dots. A size of the second particles is smaller than a size of the first particles.

8 Claims, 9 Drawing Sheets

(52) U.S. Cl.
CPC ...... *H01L 51/5096* (2013.01); *H01L 51/5206* (2013.01); *H01L 51/5221* (2013.01); *H01L 51/56* (2013.01); *H01L 2251/301* (2013.01); *H01L 2251/5369* (2013.01)

(56) References Cited

U.S. PATENT DOCUMENTS

| | | |
|---|---|---|
| 2011/0220880 A1 | 9/2011 | Cheng et al. |
| 2012/0138894 A1 | 6/2012 | Qian et al. |
| 2018/0254421 A1 | 9/2018 | Kinge et al. |
| 2019/0006541 A1 | 1/2019 | So et al. |

OTHER PUBLICATIONS

Sergey Dayneko et al., "Effect of surface ligands on the performance of organic light-emitting diodes containing quantum dots", Optoelectronic Devices and Integration V, Proc. of SPIE vol. 9270, 927009, 2014.

Ayaskanta Sahu et al., "Electronic Impurity Doping in CdSe Nanocrystals", Nano Letter, Published on Apr. 25, 2012, 2012, 12, American Chemical Society, p. 2587-2594.

C.S. Suchand Sandeep et al., "High charge-carrier mobility enables exploitation of carrier multiplication in quantum-dot films", Nature Communications, Published Aug. 23, 2013, p. 1-6.

QUANTUM DOT LIGHT-EMITTING DIODE AND MANUFACTURING METHOD THEREOF

CROSS-REFERENCE TO RELATED APPLICATION

This application claims priority to Taiwan Application Serial Number 108105677, filed Feb. 20, 2019, which is herein incorporated by reference in its entirety.

BACKGROUND

Field of Invention

The present disclosure relates to a quantum dot light-emitting diode and a manufacturing method thereof.

Description of Related Art

The electrons with unstable excitation states in a quantum dot (QD) light-emitting diode transfer from the Highest Occupied Molecular Orbital (HOMO) to the Lowest Unoccupied Molecular Orbital (LUMO) and hence a luminescent phenomenon occurs. Since the quantum dots have a high extinction coefficient, and a good quantum yield, the quantum dots can emit strong fluorescence. A wavelength of light emitted from the quantum dots can be controlled by a size of the quantum dots so that by controlling the size of the quantum dots, the spectrum of visible light can be emitted.

A conventional quantum dot light-emitting diode cannot control a balance between the electrons and the holes and keep the electrons in the light-emitting layer simultaneously, and therefore the light emission efficiency of the device is low and the device lifetime is reduced.

SUMMARY

Some embodiments of the present disclosure provide a quantum dot light-emitting diode and a manufacturing method thereof. By disposing an electron blocking layer between the light-emitting layer and the hole transporting layer, a balance between the electrons and the holes is improved effectively. An influence of the electrons on the hole transporting layer is prevented. Therefore, device efficiency and a device lifetime are improved. As a result, a stability of utilization of quantum dots is enhanced.

Some embodiments of the present disclosure provide a quantum dot light-emitting diode. A quantum dot light-emitting diode includes a substrate, an anode electrode layer, a cathode electrode layer, a light-emitting layer, and an electron blocking layer. The anode electrode layer is disposed on the substrate. The cathode electrode layer is disposed on the anode electrode layer. The light-emitting layer is disposed between the cathode electrode layer and the anode electrode layer. The light-emitting layer includes a plurality of first particles. The electron blocking layer is disposed between the light-emitting layer and the anode electrode layer. The electron blocking layer includes a plurality of second particles. The first particles and the second particles are quantum dots. A size of the second particles is smaller than a size of the first particles.

In some embodiments, a material of the first particles and a material of the second particles are substantially the same.

In some embodiments, the electron blocking layer includes a plurality of p-type dopants.

In some embodiments, the electron blocking layer includes Ag.

In some embodiments, the second particles have a diameter in a range from about 1 nm to about 3 nm.

In some embodiments, the first particles and the second particles are CdSe.

In some embodiments, the electron blocking layer includes CdSe.

In some embodiments, the quantum dot light-emitting diode further includes at least one hole transporting layer and an electron transporting layer. The hole transporting layer is disposed between the anode electrode layer and the electron blocking layer. The hole transporting layer is in direct contact with the electron blocking layer. The electron transporting layer is disposed between the cathode electrode layer and the light-emitting layer. The electron transporting layer is in direct contact with the light-emitting layer.

In some embodiments, a method of manufacturing a quantum dot light-emitting diode includes disposing a transparent electrode on a substrate; disposing a Cd-containing layer on the transparent electrode; doping the Cd-containing layer with a plurality of p-type dopants; disposing a light-emitting layer on the Cd-containing layer; and disposing a metal electrode on the light-emitting layer.

In some embodiments, the method further includes disposing an organic layer between the Cd-containing layer and the transparent electrode. The organic layer is a multi-layer structure.

In some embodiments, method further includes disposing a metal oxide layer between the metal electrode and the Cd-containing layer. The Cd-containing layer includes a plurality of quantum dots having a diameter in a range from about 1 nm to about 3 nm.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
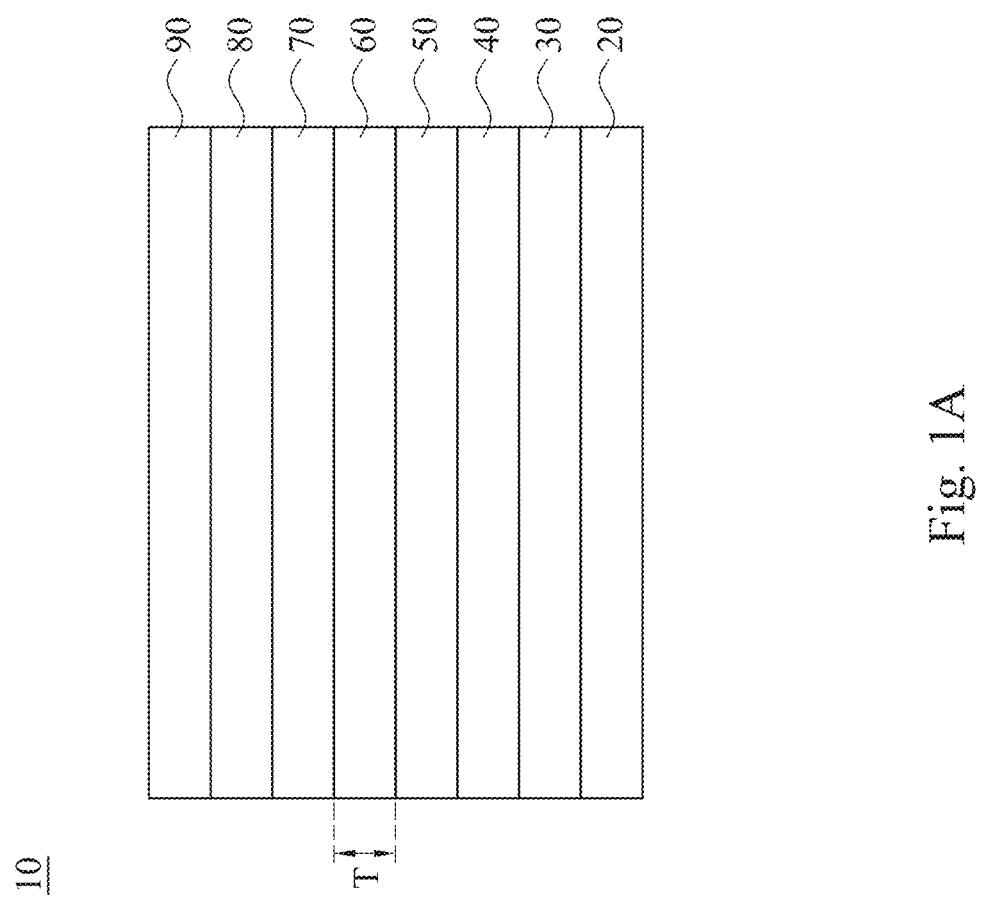
FIG. 1A is a cross-sectional view of a quantum dot light-emitting diode according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1A is a cross-sectional view of a quantum dot light-emitting diode 10 according to some embodiments of the present disclosure. The quantum dot light-emitting diode 10 includes a substrate 20, an anode electrode layer 30, a hole injection layer (HIL) 40, a hole transporting layer (HTL) 50, an electron blocking layer (EBL) 60, a light-emitting layer 70, an electron transporting layer (ETL) 80, and a cathode electrode layer 90. The anode electrode layer 30 is disposed on the substrate 20. The hole transporting layer 50 is disposed between the anode electrode layer 30 and the electron blocking layer 60. The hole transporting layer 50 is in direct contact with the electron blocking layer 60. The light-emitting layer 70 is disposed between the cathode electrode layer 90 and the anode electrode layer 30. The electron blocking layer 60 is disposed between the light-emitting layer 70 and the anode electrode layer 30. The electron transporting layer 80 is disposed between the cathode electrode layer 90 and the light-emitting layer 70. The electron transporting layer 80 is in direct contact with the light-emitting layer 70. The cathode electrode layer 90 is disposed on the anode electrode layer 30.

The substrate 20 may be a glass substrate, a metal substrate, a plastic substrate, or a flexible substrate. The anode electrode layer 30 may be made of a conductive material having a high work function. For example, the anode electrode layer 30 may be made of a transparent conductive material such as indium zinc oxide (ITO), indium zinc oxide (IZO), or the like, or a combination thereof.

The hole injection layer 40 and the hole transporting layer 50 may be organic layers. For example, the hole injection layer 40 may include, but is not limited to, molybdenum trioxide ($MoO_3$), 1,4,5,8,9,11-hexaazatriphenylene (HAT-CN), or conductive polymers (e.g., poly(3,4-ethylenedioxythiophene) (PEDOT), or poly(3,4-ethylenedioxythiophene): polystyrene sulfonate (PEDOT:PSS). The hole transporting layer 50 may include, but is not limited to, poly N-vinyl carbazole (PVK), poly(4-butylphenyldiphenylamine) (poly-TPD), poly[(9,9-dioctylfluorenyl-2,7-diyl)-co-(4,4'-(N-(4-sec-butylphenyl))diphenyl-amine)] (poly-TFB), tris(4-carbazoyl-9-ylphenyl)amine) (TCTA), and N,N'-bis(1-naphthalenyl)-N,N'-diphenyl-1,1'-biphenyl-4,4'-diamine (NPB).

In some embodiments, the light-emitting layer 70 may be a Cd-containing layer. In particular, the light-emitting layer 70 includes a plurality of first particles. In some embodiments, the first particles may be quantum dots. The first particles include a core in a central region thereof and a shell covering the core. The light emits from the core. Ligands making the first particles dispersible in the solvents may be attached to a surface of the shell. An energy band gap of the core is different from an energy band gap of the shell.

The first particles may be a nanoscale semiconductive material formed of a compound of group II and group VI or a compound of group III and group V elements of the periodic table of elements, such as, for example, Cadmium Selenium (CdSe), Cadmium Sulfide (CdS), Cadmium Telluride (CdTe), Zinc Selenium (ZnSe), zinc telluride (ZnTe), Zinc Sulfide (ZnS), mercury telluride (HgTe), Indium Arsenide (InAs), Indium Phosphide (InP), gallium arsenide (GaAs), or the like, or a combination thereof.

The electron blocking layer 60 includes a plurality of second particles. In some embodiments, the second particles may include quantum dots. For example, the second particles may be nanoscale semiconductive material formed of a compound of group II and group VI or a compound of group III and group V elements of the periodic table of elements, such as, for example, Cadmium Selenium (CdSe), Cadmium Sulfide (CdS), Cadmium Telluride (CdTe), Zinc Selenium (ZnSe), zinc telluride (ZnTe), Zinc Sulfide (ZnS), mercury telluride (HgTe), Indium Arsenide (InAs), Indium Phosphide (InP), gallium arsenide (GaAs), or the like, or a combination thereof. A thickness of the electron blocking layer 60 may be in a range from about 10 nm to about 15 nm.

In some embodiments, a material of the first particles and a material of the second particles are substantially the same. For example, the first particles and the second particles include CdSe. In some embodiments where the first particles and the second particles including CdSe, a size of the second particles is smaller than a size of the first particles. For example, a diameter of the second particles is in a range from about 1 nm to about 3 nm. A diameter of the first particles is greater than about 3 nm. An electric transport property of a nanocrystal is related to a size thereof. For example, an electron mobility increases with an increase in a diameter of the nanocrystal. A charge transport could be described in terms of the nearest-neighbor-hopping mechanism with an activation energy and a pre-exponential factor. The activation energy can be viewed as a size-dependent charging energy of an individual nanocrystal. Therefore, because a size of the quantum dot is proportional to the electron mobility, by making the size of the second particles smaller than the size of the first particles, an electron mobility of electrons in the electron blocking layer 60 is less than an electron mobility of the electrons in the light-emitting layer 70. As a result, the electrons are effectively kept in the light-emitting layer 70 and device efficiency is increased. The electrons are prevented from affecting the hole transporting layer 50. Therefore, a device lifetime is increased. A stability of utilization of the quantum dots is increased.

In some embodiments, the electron blocking layer 60 is formed using a layer-by-layer (LBL) deposition. In particular, by using the layer-by-layer (LBL) deposition to form the electron blocking layer 60, the second particles may have short ligands. Therefore, by changing the carbon chain length of the ligands of the second particles, the electron mobility and the hole mobility of the electron blocking layer 60 is controlled.

The electron blocking layer 60 is doped with a plurality of p-type dopants prior to disposing the light-emitting layer 70 on the electron blocking layer. In some embodiments where the second particles include CdSe, the p-type dopants may be Ag. The electron blocking layer 60 may be substitutionally doped or interstitially doped with Ag. In some embodiments, doping the electron blocking layer 60 with Ag makes $Ag_2Se$ form in the electron blocking layer 60. By substitutionally doping the electron blocking layer 60 with Ag, Ag can provide additional holes to the electron blocking layer 60 and decrease the electron mobility thereof. Therefore, elections are kept in the light-emitting layer 70 effectively and hence the device efficiency is enhanced. Electrons are prevented from affecting the hole transporting layer 50 as well. As a result, the device lifetime is increased and a stability of utilization of quantum dots is improved.

The electron transporting layer 80 may be a metal oxide layer, for example, ZnO, $TiO_2$, $ZrO_2$, ZnMgO, $SnO_2$, the like, or a combination thereof.

The cathode electrode layer 90 may be made of a conductive material having a low work function. For example, the cathode electrode layer 90 may be a metal electrode made of Al, Mg, or Al—Mg alloy.

Figure 1B:
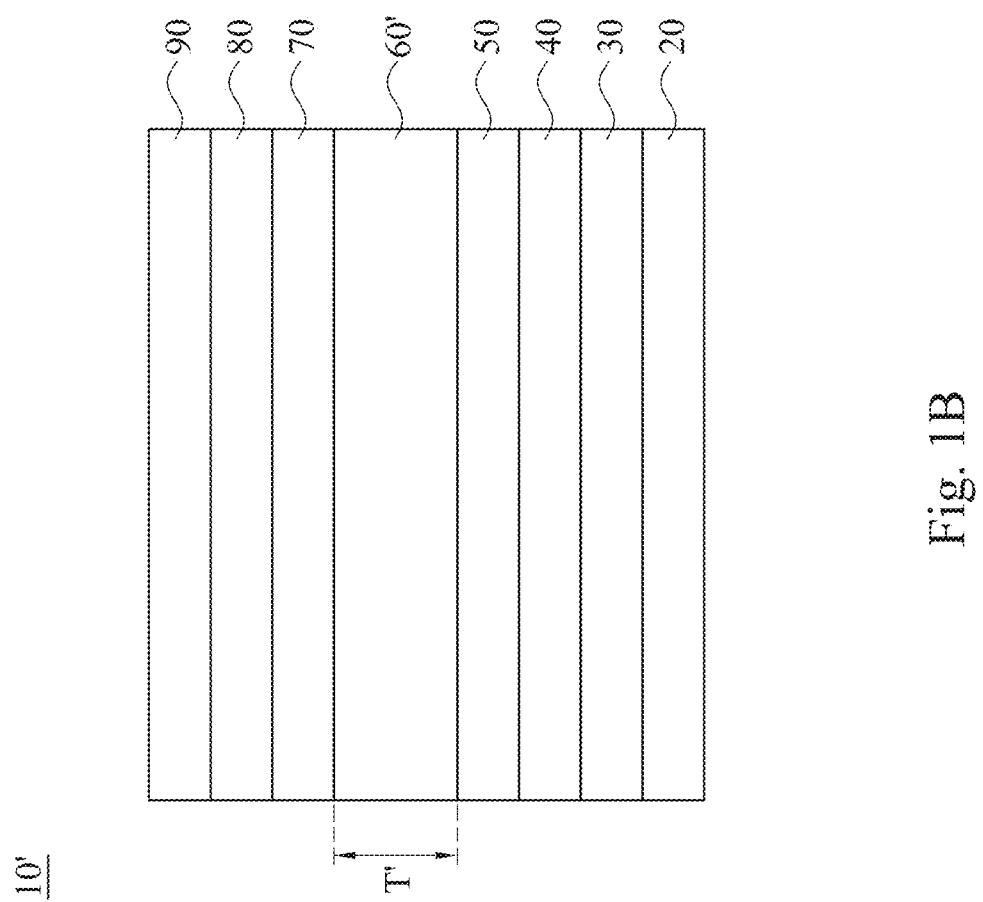
FIG. 1B is a cross-sectional view of a quantum dot light-emitting diode according to some other embodiments of the present disclosure.

FIG. 1B is a cross-sectional view of a quantum dot light-emitting diode 10' according to some embodiments of the present disclosure. The main difference between the quantum dot light-emitting diode 10' and the quantum dot light-emitting diode 10 is that: a thickness T' of the electron blocking layer 60' of the quantum dot light-emitting diode 10' is greater than a thickness T of the electron blocking layer 60 of the quantum dot light-emitting diode 10. For example, the thickness T' is in a range from about 20 nm to about 100 nm. A current efficiency of the luminance of the quantum dot light-emitting diode 10 is better than a current efficiency of the luminance of the quantum dot light-emitting diode 10'. It is to be noted that the elements and the connection relationships of the elements described above will not be repeated in the following description.

Figure 2A:
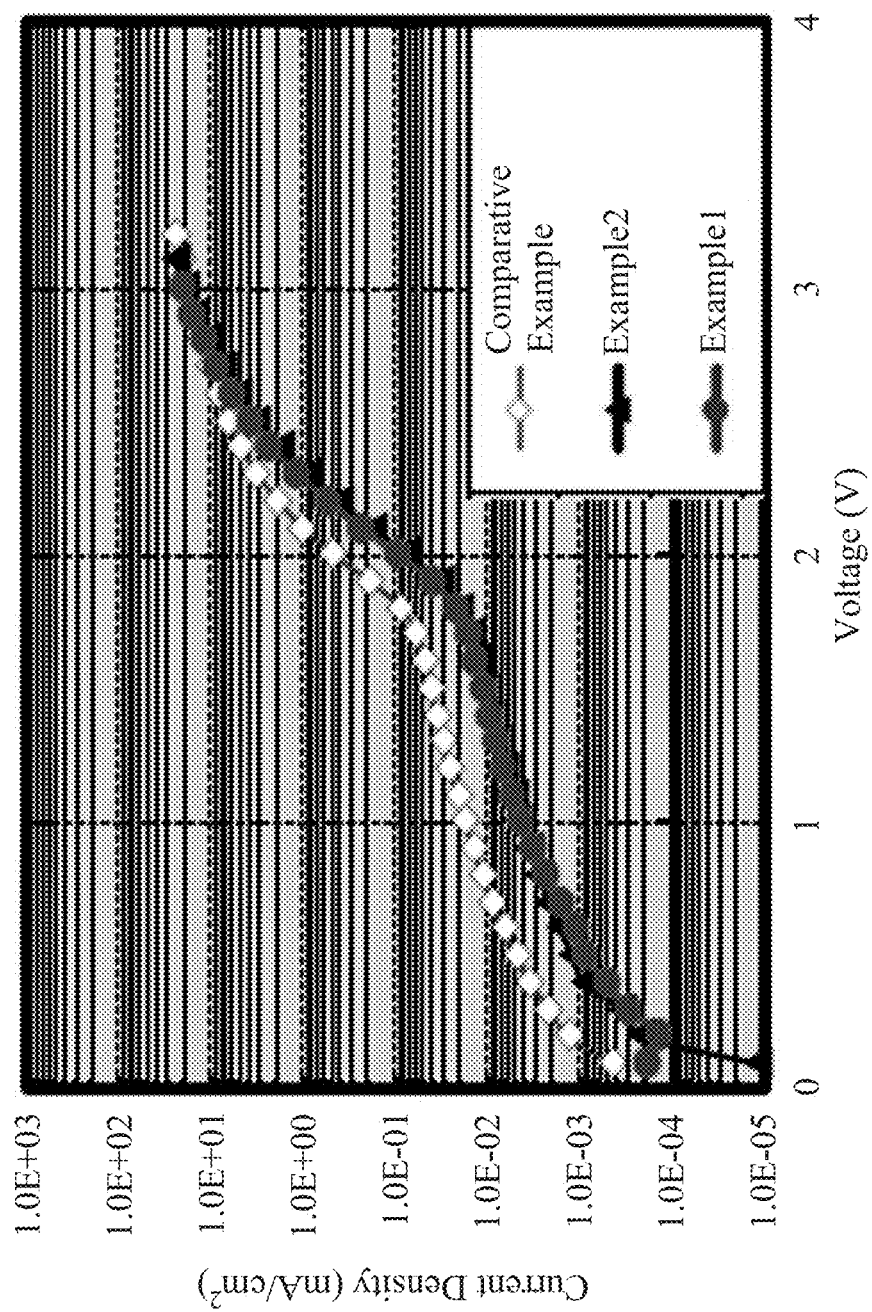
FIG. 2A is a graph illustrating current density-voltage (J-V) curves of the quantum dot light-emitting diodes of Examples 1 and 2 according to the present disclosure and a Comparative Example.
Figure 2B:
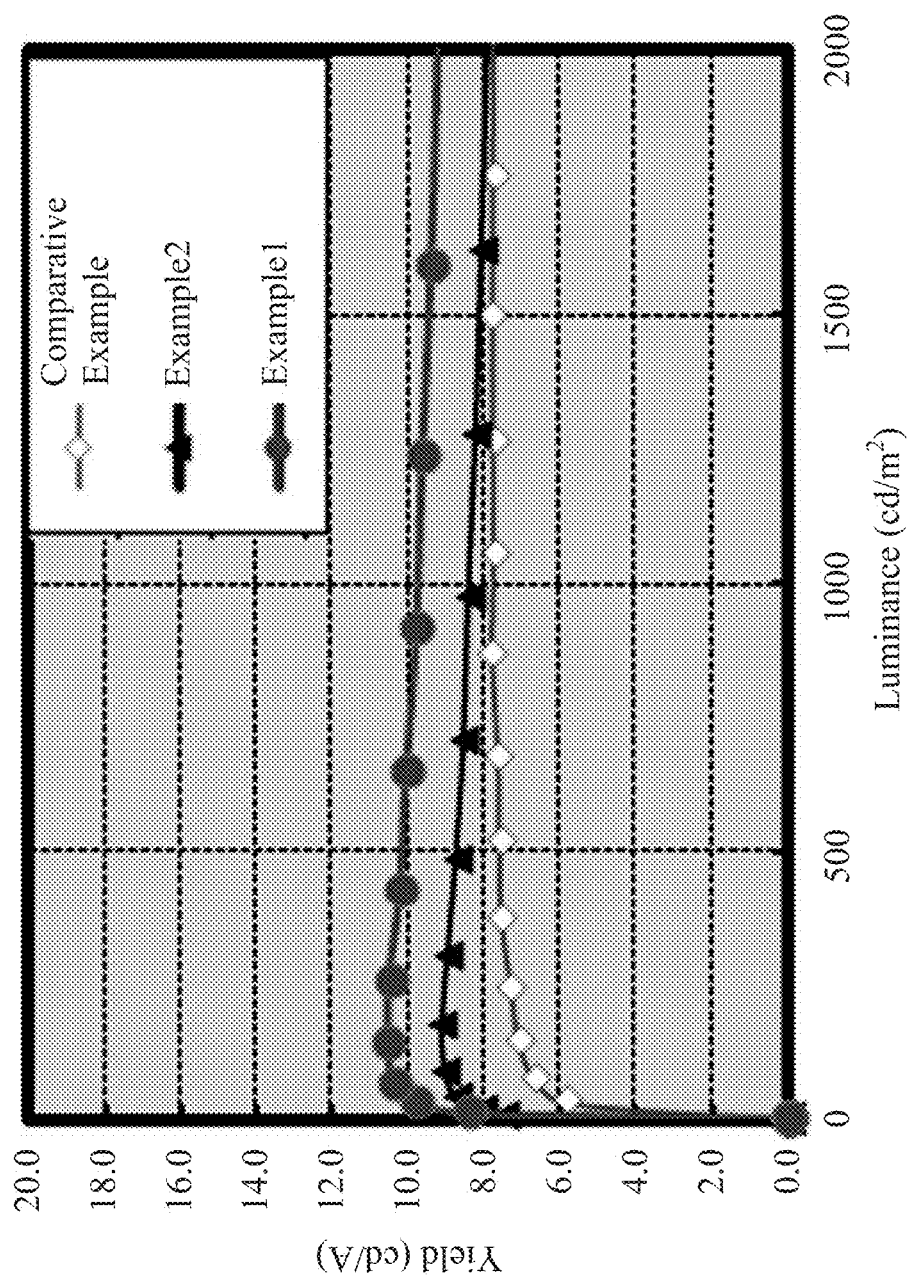
FIG. 2B is a graph illustrating current efficiencies of the luminance of the quantum dot light-emitting diodes of Examples 1 and 2 according to the present disclosure and a Comparative Example.

FIGS. 2A and 2B are characteristic comparison diagram of the quantum dot light-emitting diode 10 (Example 1) including the electron blocking layer 60 and the quantum dot light-emitting diode 10' (Example 2) including the electron blocking layer 60' according to some embodiments of the present disclosure and a Comparative Example. The Comparative Example does not have an electron blocking layer 60 but has the substrate 20, the anode electrode layer 30, a hole injection layer 40, a hole transporting layer 50, a light-emitting layer 70, an electron transporting layer 80, and a cathode electrode layer 90.

FIG. 2A is a graph illustrating current density-voltage (J-V) curves. As shown in FIG. 2A, a property of the carrier of the quantum dot light-emitting diode 10 and a property of the carrier of the quantum dot light-emitting diode 10' are better than a property of the carrier of the Comparative Example. FIG. 2B shows luminance-current efficiency (Yield) curves. A current efficiency of the luminance of the quantum dot light-emitting diode 10 and a current efficiency of the luminance of the quantum dot light-emitting diode 10' are better than a current efficiency of the luminance of the Comparative Example.

Figure 3:
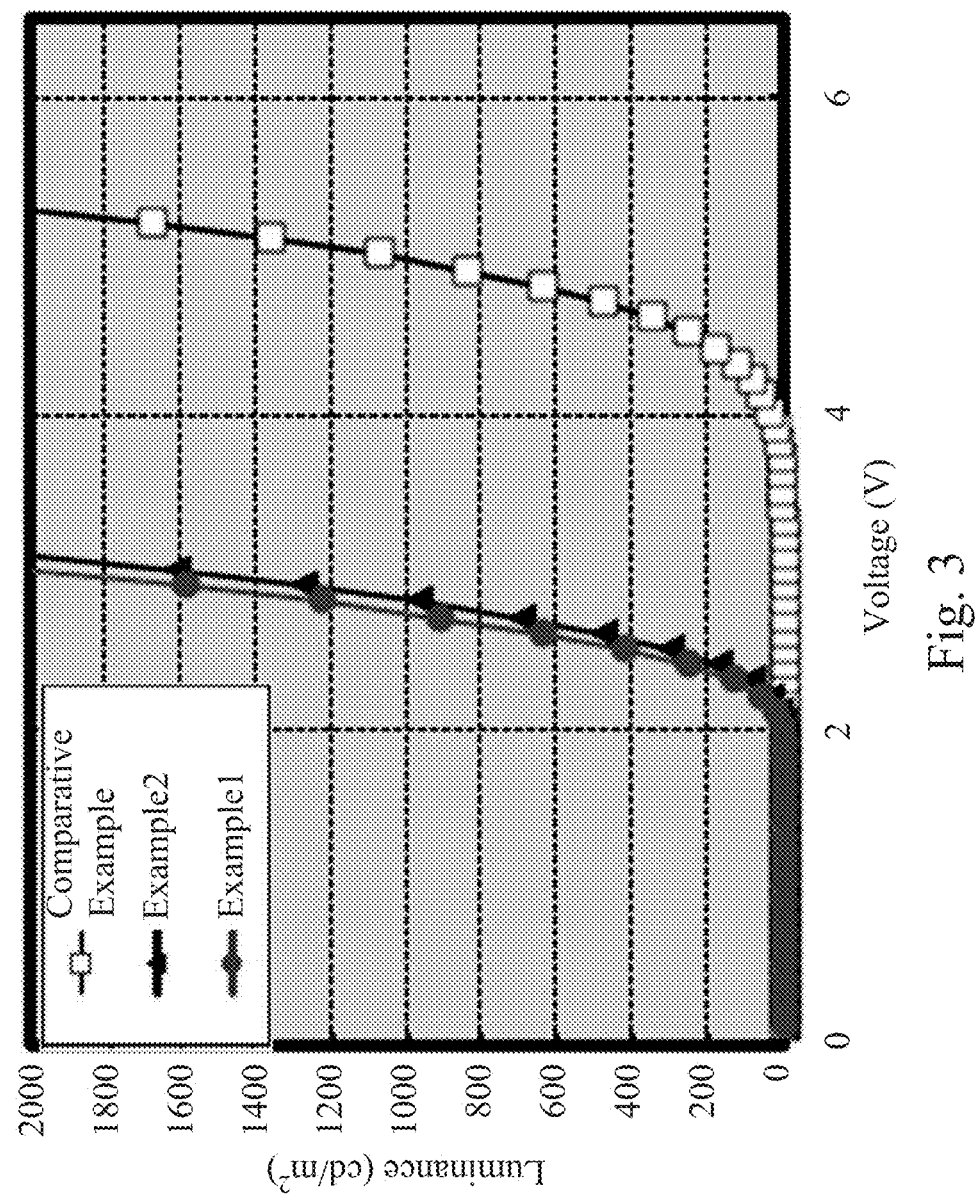
FIG. 3 is a graph illustrating luminance-voltage (L-V) characteristics of the quantum dot light-emitting diodes of Examples 1 and 2 according to the present disclosure and a Comparative Example.

FIG. 3 is characteristic comparison diagram of luminance-voltage (L-V) characteristics of the quantum dot light-emitting diode 10 including the electron blocking layer 60, the quantum dot light-emitting diode 10' including an electron blocking layer 60' and a Comparative Example. The Comparative Example does not have an electron blocking layer 60 but have two layers of hole transporting layers. In particular, the Comparative Example includes the substrate 20, the anode electrode layer 30, a hole injection layer 40, two hole transporting layers, a light-emitting layer 70, an electron transporting layer 80, and a cathode electrode layer 90. Materials of the two hole transporting layers include TFB and PVK, respectively. As shown in FIG. 3, the quantum dot light-emitting diodes 10 and 10' according to the present disclosure have better device efficiency and higher device lifetime than the device efficiency and device lifetime of the comparative example. In particular, the lifetime of the quantum dot light-emitting diodes 10 and 10' is about 18.3 times the lifetime of the Comparative Example.

For the purpose of description and verification of influence of disposing the electron blocking layer 60 between the light-emitting layer 70 and the hole transporting layer on the quantum dot light-emitting diode 10, an electron-only device and a hole-only device are formed to compare the hole transporting and electron transporting in the quantum dot light-emitting diode 10.

Figure 4:
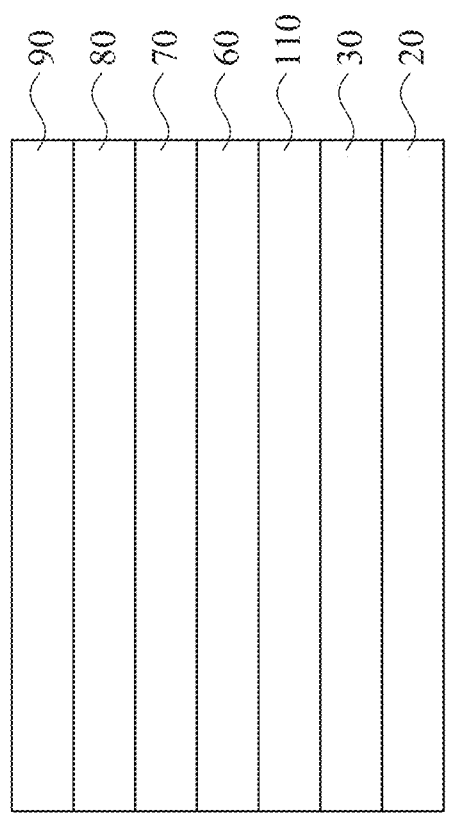
FIG. 4 is a cross-sectional view of an electron-only device according to some embodiments of the present disclosure.
Figure 5:
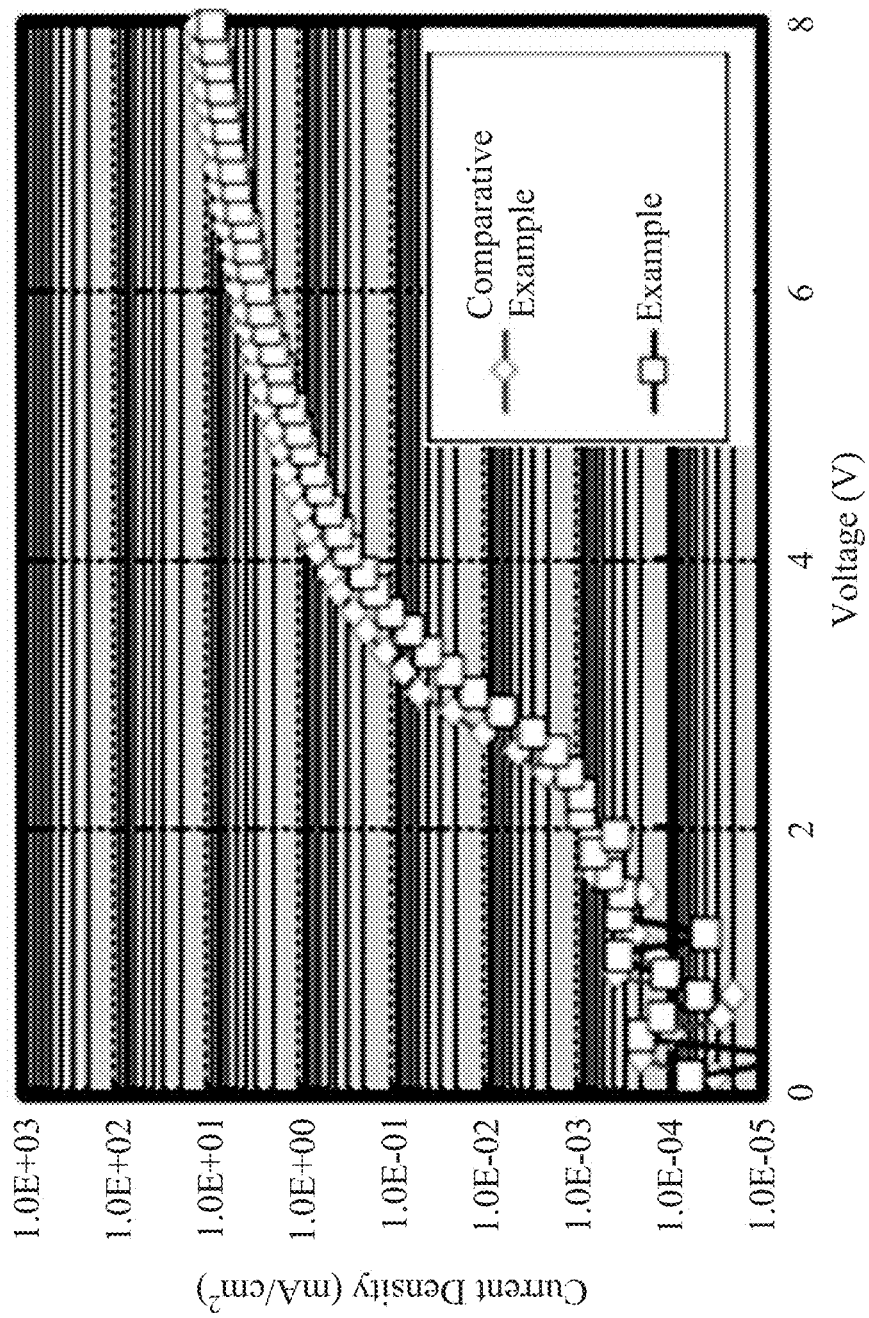
FIG. 5 is a graph illustrating current density-voltage (J-V) curves of the electron-only device of an Example according to the present disclosure and a Comparative Example.

FIG. 4 is a cross-sectional view of an electron-only device 100 according to some embodiments of the present disclosure. The electron-only device 100 includes the anode electrode layer 30, the electron transporting layer 110, the electron blocking layer 60, the light-emitting layer 70, the electron transporting layer 80, and the cathode electrode layer 90. FIG. 5 is a graph illustrating current density-voltage (J-V) curves of the electron-only device 100 of an Example according to the present disclosure and an electron-only device according to a Comparative Example. The Comparative Example does not have the electron blocking layer 60 but has the substrate 20, the anode electrode layer 30, the electron transporting layer 110, the light-emitting layer 70, the electron transporting layer 80, and the cathode electrode layer 90. As shown in FIG. 5, an electron current density of the electron-only device 100 is less than an electron current density of the Comparative Example. That is to say, the electron blocking layer 60 is beneficial in reducing the electron current density. A material of the electron transporting layer 110 is similar to a material of the electron transporting layer 80 and will not be repeated in the following description.

Figure 6:
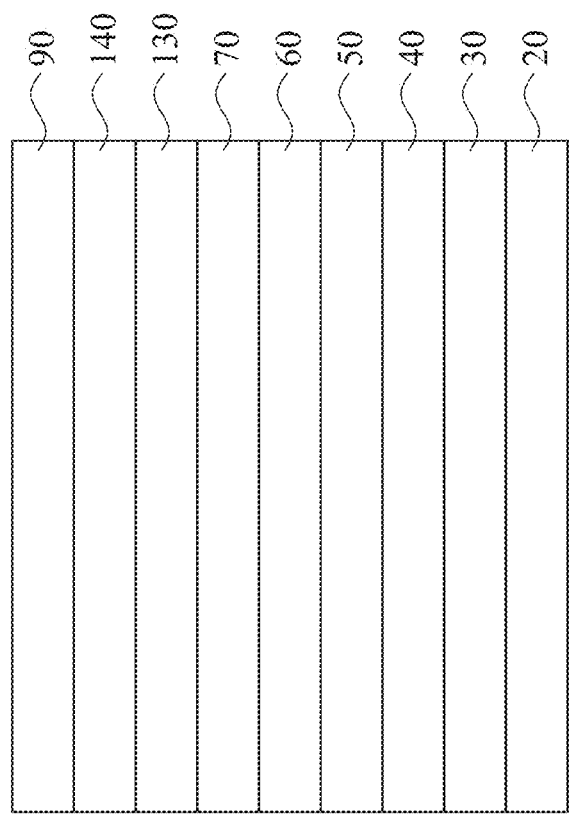
FIG. 6 is a cross-sectional view of a hole-only device according to some embodiments of the present disclosure.
Figure 7:
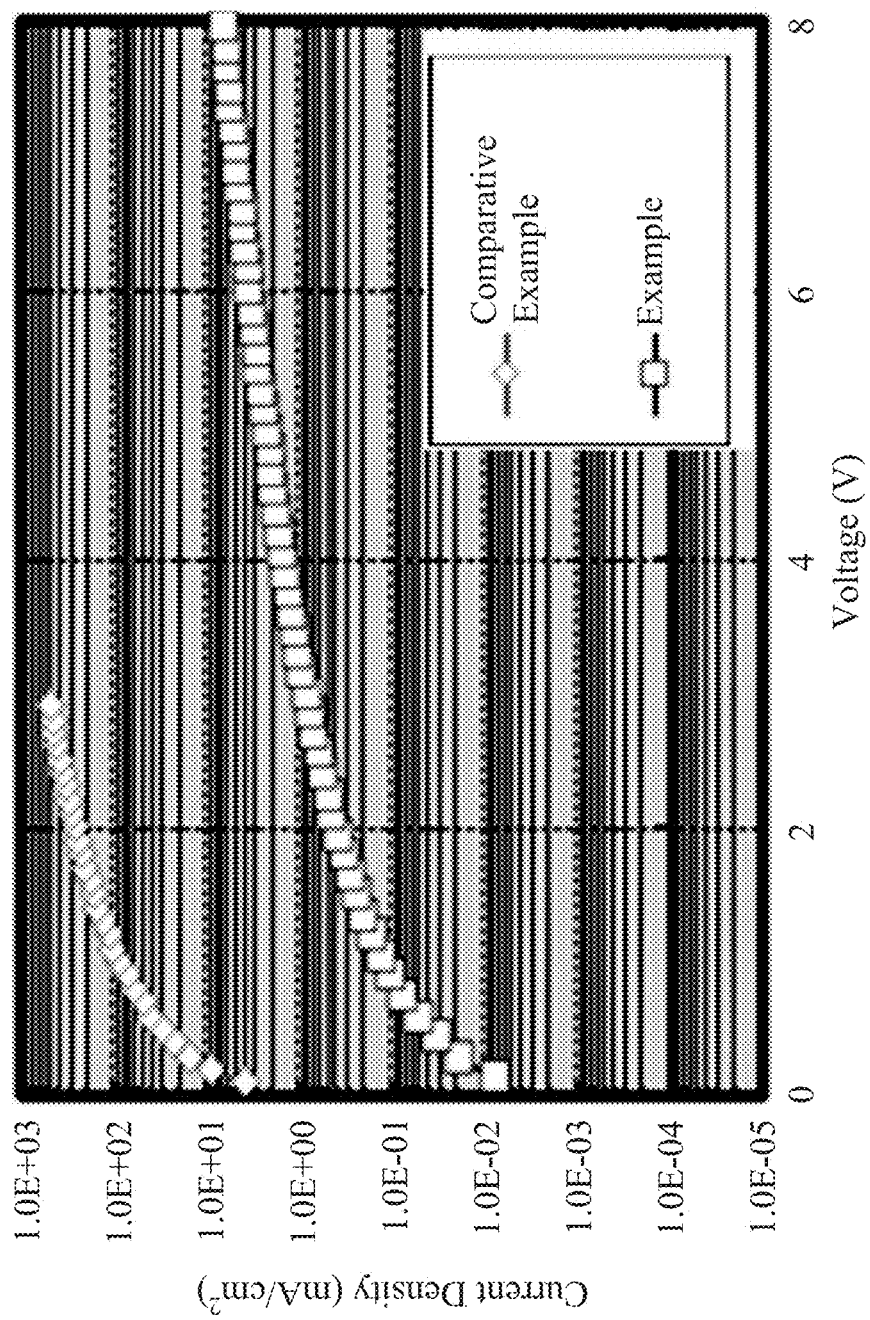
FIG. 7 is a graph illustrating current density-voltage (J-V) curves of the hole-only device of an Example according to the present disclosure and a Comparative Example.

FIG. 6 is a cross-sectional view of a hole-only device 120 according to some embodiments of the present disclosure. The hole-only device 120 includes the anode electrode layer 30, the hole injection layer 40, the hole transporting layer 50, the electron blocking layer 60, the light-emitting layer 70, the hole transporting layer 130, the hole injection layer 140, and the cathode electrode layer 90 sequentially disposed on the substrate 20. FIG. 7 is a graph illustrating current density-voltage (J-V) curves of the hole-only device 120 of an Example according to the present disclosure and a Comparative Example. The Comparative Example does not have the electron blocking layer 60 but have the anode electrode layer 30, the hole injection layer 40, the hole transporting layer 50, the light-emitting layer 70, the hole transporting layer 130, the hole injection layer 140, and the cathode electrode layer 90. As shown in FIG. 7, the hole current density of the hole-only device 120 is similar to the hole current density of the Comparative Example. That is to say, the electron blocking layer 60 may not affect the hole current density. A material of the hole transporting layer 130 and a material of the hole injection layer 140 may be similar to a material of the hole transporting layer 50 and a material of the hole injection layer 40, respectively, and will not be repeated in the following description.

As discussed above, the electron blocking layer 60 may block the electrons from passing through the light-emitting layer 70 and affecting the hole transporting layer 50 and may not affect the hole transporting to the light-emitting layer 70. As a result, the electron blocking layer 60 is beneficial for improving the balance between the electron and the hole effectively and makes the electrons be kept in the light-emitting layer 70 and thus improves the device efficiency of the quantum dot light-emitting diode 10. The influence of the electrons on the hole transporting layer 50 is also prevented and thus the aging behavior of the device is alleviated, which in turn increases the device lifetime.

Therefore, the stability of utilization of the quantum dot light-emitting diode 10 is improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A quantum dot light-emitting diode, comprising:
   a substrate,
   an anode electrode layer disposed on the substrate;
   a cathode electrode layer disposed on the anode electrode layer;
   a light-emitting layer disposed between the cathode electrode layer and the anode electrode layer, wherein the light-emitting layer includes a plurality of first particles; and
   an electron blocking layer disposed between the light-emitting layer and the anode electrode layer, wherein the electron blocking layer includes a plurality of second particles, the first particles and the second particles are quantum dots, and a size of the second particles is smaller than a size of the first particles.

2. The quantum dot light-emitting diode of claim 1, wherein a material of the first particles and a material of the second particles are substantially the same.

3. The quantum dot light-emitting diode of claim 1, wherein the electron blocking layer includes a plurality of p-type dopants.

4. The quantum dot light-emitting diode of claim 1, wherein the electron blocking layer includes Ag.

5. The quantum dot light-emitting diode of claim 1, wherein the second particles have a diameter in a range from about 1 nm to about 3 nm.

6. The quantum dot light-emitting diode of claim 1, wherein the first particles and the second particles are CdSe.

7. The quantum dot light-emitting diode of claim 1, wherein the electron blocking layer includes CdSe.

8. The quantum dot light-emitting diode of claim 1, further comprising:
   at least one hole transporting layer disposed between the anode electrode layer and the electron blocking layer, wherein the hole transporting layer is in direct contact with the electron blocking layer; and
   an electron transporting layer disposed between the cathode electrode layer and the light-emitting layer, wherein the electron transporting layer is in direct contact with the light-emitting layer.

* * * * *